HIGH IDLER DIODE PARAMETRIC AMPLIFIER

Filed Oct. 14, 1968

INVENTORS.
PETER LOMBARDO
EDMUND MOLEY
JAMES WHELEHAN

BY
ATTORNEY.

3,518,562
HIGH IDLER DIODE PARAMETRIC AMPLIFIER

Peter Lombardo, Huntington Station, N.Y., Edmund Moley, Murray Hill, N.J., and James Whelehan, Hauppauge, N.Y., assignors to Cutler-Hammer, Inc., Milwaukee, Wis., a corporation of Delaware Filed Oct. 14, 1968, Ser. No. 767,123
Int. Cl. H03f *7/00*
U.S. Cl. 330—4.9 5 Claims

ABSTRACT OF THE DISCLOSURE

A parametric amplifier using a varactor diode which is self resonant at some frequency other than the idler frequency. The diode is artificially resonated to the idler by placing an idler filter in the signal line at a point such that the portion of the line between the filter and the diode transforms the high impedance of the filter to a reactance equal and opposite to that of the diode at the idler frequency.

BACKGROUND

Field of the invention

Figure 1:
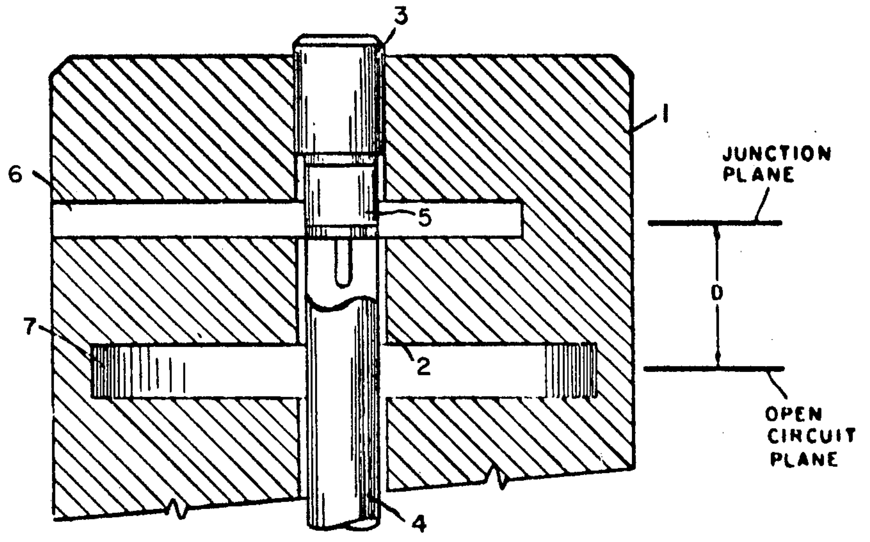

The invention relates to parametric amplifiers of the type in which a semiconductor diode is operated as a variable capacitor. A high frequency pump voltage applied to the diode causes it to exhibit negative resistance to signal energy of a substantially lower frequency, causing reflection of the signal with amplification.

Prior art

Prior art parametric amplifiers are illustrated by the following United States Patents: 3,040,267, Seidel, June 19, 1962; 3,105,941, Kliphuis, Oct. 1, 1963; 3,127,566, Lombardo, Mar. 31, 1964.

Some theoretical aspects of such amplifiers are discussed in Greene et al.: Proceedings of the IRE, Sept. 1960, pages 1583–1590. A more general and less mathematical discussion appears in the Bell Telephone System Monograph 3784 by E. D. Reed, published in 1961.

The foregoing references represent the most pertinent prior art presently known to applicants. They describe various approaches to improving the bandwidth and noise characteristics of diode parametric amplifiers while maintaining the required isolation between the signal, pump and idler components.

For minimum noise generation in a parametric amplifier, two conditions must be met:

(a) The idler should be at a theoretically optimum frequency, which is generally substantially higher than the self resonant frequencies of available varactor diodes.

(b) Any idler loading externally of the diode itself should be minimized.

To obtain the maximum instantaneous bandwidth, a third condition should also be met; the varactor diode should be resonant at the idler frequency.

The Seidel patent is directed to broadbanding a parametric amplifier by placing a band pass transmission network between the signal circuit and the diode. The network also isolates the pump and idler from the signal circuit. However, none of the three conditions mentioned above is considered or satisfied.

Lombardo operates with the diode in series self resonance at the idler frequency, and supplies pump power to it through a quarter wavelength transmission line from a high impedance source. Both the diode and the end of the quarter wavelength line connected to it act as very low impedances at the idler frequency, thereby tending to isolate the idler from the relatively higher impedance signal circuit. This arrangement meets the above conditions to some extent, but adds undesirable reactances that degrade the bandwidth, and limits the idler to the relatively low series self-resonance frequency of the diode.

Kliphuis uses two diodes in a balanced arrangement that provides geometrical isolation of the idler from the signal circuit. The diodes must be matched to each other, and they operate in series self-resonance at the idler frequency, as in Lombardo.

SUMMARY

According to this invention, the diode is series resonated to any desired frequency by utilizing a section of the signal transmission to transform the essentially open circuit impedance of an idler filter to a reactance equal and oppostie to the reactance of the diode at that frequency. The idler frequency may then be determined by design conditions other than the self resonant frequencies of the particular type of diode to be used.

The idler power is confined to the relatively short terminal position of the signal line, and experiences substantially no dissipative loading other than that of the diode itself. The signal line can provide a D-C path between the diode and an external bias source, facilitating electronic tuning of the amplifier.

DRAWING

Figure 2:
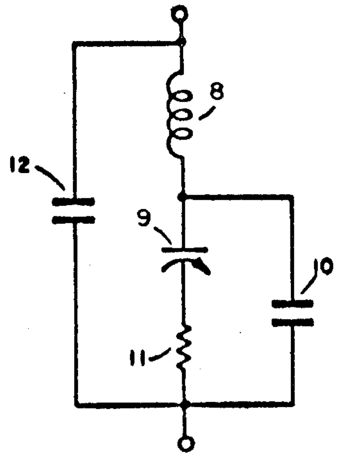

FIG. 1 is a sectional view of a portion of a parametric amplifier structure, illustrating a preferred embodiment of the invention, and FIG. 2 is a diagram of an equivalent circuit of a varactor diode.

DESCRIPTION

Referring to FIG. 1, a metal block 1 contains a cylindrical bore 2 which forms the outer conductor of a coaxial line extending vertically in the drawing. The upper end of the bore 2 is closed by a conductive plug 3. An inner line conductor 4 extends coaxially of the bore 2 toward the plug 3. A varactor diode 5 is connected between and supported by the adjacent ends of the conductor 4 and the plug 3.

A rectangular waveguide 6 is formed in the block 1, extending laterally from the exterior surface and across the bore 2 in the region of the junction plane of the diode 5. The dimensions of the guide 6 are such that it will transmit pump frequency energy, but will not transmit the somewhat lower frequency idler.

A radial groove 7 extends outwardly from the bore 2, to a depth that is electrically equivalent to one quarter wavelength at the idler frequency. The groove 7 is located at a distance D from the junction plane, determined as will be described.

Referring to FIG. 2, the inductor 8 represents the lead inductance of the varactor. The capacitor 9 represents the junction capacitance, which varies with respect to some quiescent value $C_0$ as a function of the voltage across it. The capacitor 10 represents the stray capacitance across the junction, and the resistor 11 the total series resistance of the varactor. The capacitor 12 represents the case capacitance, which is a stray capacitance effectively between the external terminals of the varactor.

The varactor diode exhibits self resonance at two frequencies: series self resonance occurs at the frequency where the reactance of the inductor 8 is equal in magnitude to that of the capacitors 9 and 10 in parallel with each other, and parallel self resonance at the frequency where the reactance of the inductor 8 is equal in magnitude to that of the capacitance 12 in series with the parallel combination of capacitors 9 and 10. The parallel self resonant frequency is generally substantially higher than the series self resonant frequency. At frequencies lower than the series self resonant frequency, the diode exhibits capacitive reactance. At frequencies between the series and parallel self resonant frequencies, it exhibits inductive reactance. At frequencies above parallel self resonance, the reactance is capacitive.

Assume that the desired idler frequency is between the series and parallel self resonant frequencies of the type of diode to be used. At this frequency the diode will exhibit an inductive reactance $X_L$. The numerical value of $X_L$ in ohms may be determined by direct measurement or by calculation based on measurements of the parameters illustrated in FIG. 2. The characteristic impedance $Z_o$ of the coaxial line formed by the bore 2 and conductor 4 may be determined by signal circuit impedance matching considerations. The distance D (FIG. 1) between the diode junction plane and the median plane of the groove 7 is $$D=\frac{\lambda}{2\pi}\cot^{-1}\frac{X_L}{Z_o}$$

where $\lambda$ is the idler wavelength, and D is the smallest value that will satisfy the equation.

In the above example, where the diode is inductive at the idler frequency, $D<\lambda/4$. If the desired idler frequency is either below the series self resonance or above the parallel self resonance of the diode, the diode will exhibit a capacitive reactance $X_c$. The distance D may be determined by substituting the negative value $(-X_c)$ in the above formula. In this case, D is greater than $\lambda/4$ but less than $\lambda/2$.

In operation, the signal to be amplified is conducted by way of the coaxial line 2, 4 to the varactor 5. Pump power is supplied through the waveguide 6, producing a voltage at the pump frequency across the varactor. This causes the varactor to exhibit negative resistance to the signal, and reflect amplified signal which is transmitted by the coaxial line to the external signal circuit. The amplification process involves a frequency mixing action that produces an image signal, generally referred to as the idler. The idler frequency is the difference between the pump and signal frequencies.

The groove 7 constitutes a short circuited radial transmission line, approximately one quarter wavelength long at the idler frequency, and presents an open circuit to the idler in the outer conductor of the coaxial signal line. The effective plane of the open circuit is midway between the upper and lower surfaces of the groove, as indicated in FIG. 1. The radial line acts as a rejection filter, preventing propagation of the idler beyond the groove 7 on the coaxial signal line. The waveguide 6 is beyond cutoff to the idler frequency. Accordingly, the idler power is confined to the immediate region of the varactor and the adjacent length D of the coaxial line. Substantially the only dissipative idler loading is that of the varactor itself.

Insofar as the idler is concerned, the coaxial line acts as a stub of length D, connected to the varactor at one end and open circuited at the other end. The reactance presented to the varactor by this stub may be made to have any desired magnitude, capacitive or inductive, at any desired frequency, by appropriate choice of the length D. When the length is determined as described above, the stub reactance is equal and opposite to the varactor reactance at the idler frequency, and the varactor is resonated at that frequency.

Because the choice of idler frequency may be made independently of the self resonance frequencies of the varactor, parametric amplifiers of the described type can be designed to operate at room temperature with effective noise temperatures previously unattainable without cryogenic systems. The relatively simple additional structure required to resonate the varactor introduces no undesirable reactances that vary sharply as a function of frequency and does not tend to seriously degrade the bandwidth. The idler filter, which would be required in any event, is put to additional use as part of the varactor resonating means.

The use of a two conductor signal line, such as the coaxial line 2, 4 in the described embodiment of FIG. 1, provides electrically conductive paths to both terminals of the varactor, enabling the application of a D-C bias to the varactor from an external source. Such bias may be adjusted in known manner to tune the amplifier by varying the quiescent capacitance $C_o$ of the varactor.

We claim:

1. A parametric amplifier including a varactor diode, a transmission line for conducting signal to said diode and amplified signal way from said diode, and means for supplying pump power to said diode, wherein the improvement consists in that:

(a) the diode is self resonant at a frequency other than the idler frequency and exhibits reactance to the idler, (b) said signal transmission line is provided with a filter device that acts as substantially an open circuit in said line at the idler frequency, thereby preventing transmission of idler energy to the external signal circuit, and (c) said filter device is located at a distance from said diode along said signal transmission line such that the portion of said line between said filter device and said diode transforms the open circuit presented by said filter to a reactance equal and opposite to that exhibited by the diode at the idler frequency.

2. The invention set forth in claim 1, wherein said signal transmission line comprises two discrete conductors and provides a D-C path for application of bias to said diode.

3. The invention set forth in claim 1, wherein said signal transmission line is a coaxial line and said filter device is a short circuited radial line extending outwardly from the outer conductor of said signal transmission line.

4. The invention set forth in claim 1, wherein said diode is series self resonant at a frequency lower than the idler frequency, and said potrion of said signal transmission line between said filter device and said diode is shorter than one quarter wavelength at the idler frequency.

5. The invention set forth in claim 1, wherein said diode is parallel self resonant at a frequency lower than the idler frequency, and said portion of said signal transmission line between said filter device and said diode is longer than one quarter wavelength but shorter than one half wavelength at the idler frequency.

References Cited

FOREIGN PATENTS 996,346 6/1965 Great Britain.

ROY LAKE, Primary Examiner

D. R. HOSTETTER, Assistant Examiner

U.S. Cl. X.R.

330—56